(12) United States Patent
Edel

(10) Patent No.: US 7,242,157 B1
(45) Date of Patent: Jul. 10, 2007

(54) SWITCHED-VOLTAGE CONTROL OF THE MAGNETIZATION OF CURRENT TRANSFORMS AND OTHER MAGNETIC BODIES

(76) Inventor: Thomas G. Edel, 3519 SE. 71st Ave., Portland, OR (US) 97206-2527

( * ) Notice: Subject to any disclaimer, the term of this patent is extended or adjusted under 35 U.S.C. 154(b) by 0 days.

(21) Appl. No.: 11/351,080

(22) Filed: Feb. 8, 2006

Related U.S. Application Data

(60) Provisional application No. 60/652,143, filed on Feb. 11, 2005.

(51) Int. Cl.
*H05B 37/02* (2006.01)
(52) U.S. Cl. ................. 315/362; 361/143; 323/357
(58) Field of Classification Search ........... 315/127, 315/362, 308; 361/143, 146, 149; 323/352, 323/355–358, 144
See application file for complete search history.

(56) References Cited

U.S. PATENT DOCUMENTS

| | | | |
|---|---|---|---|
| 3,768,011 A | 10/1973 | Swain | 324/117 R |
| 3,772,617 A * | 11/1973 | Ciesielka | 333/18 |
| 4,274,051 A | 6/1981 | Condon | 324/117 R |
| 4,278,939 A | 7/1981 | Henry | 324/117 R |
| 4,456,875 A | 6/1984 | Chenier | 324/726 |
| 4,914,383 A | 4/1990 | Wilkerson | 324/127 |
| 5,008,612 A | 4/1991 | Otto | 324/117 R |
| 5,053,695 A | 10/1991 | Canter | 324/117 R |
| 5,293,121 A | 3/1994 | Estes, Jr. | 324/117 R |
| 5,811,965 A | 9/1998 | Gu | 324/117 R |
| 6,028,422 A * | 2/2000 | Preusse | 323/357 |
| 6,522,517 B1* | 2/2003 | Edel | 361/143 |
| 6,577,111 B1* | 6/2003 | Dickmander et al. | 323/356 |
| 6,580,625 B2* | 6/2003 | Throngnumchai et al. | 363/97 |

* cited by examiner

*Primary Examiner*—Douglas W. Owens
*Assistant Examiner*—Jimmy Vu

(57) ABSTRACT

The magnetic flux of a magnetic body is controlled with voltage pulses from an active voltage source. The voltage pulses are applied to a winding circuit which is magnetically coupled to the magnetic body. An electronic switch means is used to generate the voltage pulses from a d-c power supply. A control circuit receives information about the winding current, and utilizes known loop impedances to optimize the voltage pulses for optimal magnetic control. Utilizing voltage pulses rather than a continuously variable voltage source has the advantage of lower cost and improved energy efficiency for many applications. The invention may be utilized for measurement of a-c current and d-c current utilizing ordinary current transformers. The switched-voltage control that is disclosed also may be used to facilitate accurate measurement of a-c current in a self-powered manner, with the power supply for the electronics deriving its power from the current transformer secondary circuit.

20 Claims, 7 Drawing Sheets

SWITCHED-VOLTAGE CONTROL OF THE MAGNETIZATION OF CURRENT TRANSFORMS AND OTHER MAGNETIC BODIES

CROSS-REFERENCE TO RELATED APPLICATION

This application claims the benefit of U.S. Provisional Patent Application No. 60/652,143, by Thomas G. Edel, filed Feb. 11, 2005.

STATEMENT REGARDING FEDERALLY SPONSORED RESEARCH

Not Applicable

REFERENCE TO A COMPACT DISC APPENDIX

Not Applicable

BACKGROUND OF THE INVENTION

This invention relates to the art of controlling magnetic flux within magnetic bodies. A switched voltage applied to a conductive winding causes the voltage induced in the winding to have such waveform and magnitude that the integral over time of the induced voltage correlates to desired changes of the magnetic induction level.

The present invention is a development of the invention disclosed in U.S. Pat. No. 6,522,517 to Edel, issued Feb. 18, 2003. This patent (U.S. Pat. No. 6,522,517) is hereby incorporated by reference, in its entirety, into this disclosure. It will be referred to herein as "the 517 patent."

The 517 patent discloses how a varying voltage, produced by a "controllable voltage device," may be applied to a conductive winding that magnetically interacts with a magnetic body. The varying voltage controls the voltage induced in the winding in such a way that the integral over time of the induced voltage correlates to desired changes of the induction of the magnetic body. (As used in this disclosure, the term "induction level" is synonymous with the terms "magnetization" and "magnetic flux density"). The induction level may be controlled in several ways:

(a) The induction level of a magnetic body may be caused to transition from a known induction level to a preferred induction level. (A preferred induction level of zero may be chosen to demagnetize a magnetic body).

(b) When the induction level is not known, a preferred induction level may be established by changing the induction level of the magnetic body from an unknown induction level to a known induction level and then to the preferred induction level.

(c) A preferred induction level may be maintained by causing the induced voltage across the winding to have an average value near zero (or by causing the integral of induced voltage to not exceed a predetermined value).

(d) A preferred induction level may be more strictly maintained by causing the induced voltage across the winding to continuously be near zero volts, thereby reducing the amount that the induction level fluctuates.

(e) The induction level may be made to vary with time in a preferred manner, including matching a control signal that is proportional to a reference induction level.

The varying voltage may be generated directly by an active voltage source, or the varying voltage may be generated indirectly, such as by current transformer secondary current flowing through an adjustable impedance. The key elements are a magnetic body, a conductive winding that magnetically interacts with the magnetic body, and a means of causing the induced voltage to have the appropriate waveform and magnitude.

A conductive winding that is utilized for controlling induction level may be a permanent winding that is also used for other purposes, or it may be a dedicated winding (permanent or temporary) provided solely for the purpose of controlling induction level.

These principles are most readily applied to magnetic bodies that are configured to have a relatively uniform magnetic path, such as the magnetic cores of current transformers. The accuracy of a current transformer may be improved in three ways:

(a) By demagnetizing a current transformer, inaccuracies associated with core magnetization are removed. A demagnetized current transformer can accurately measure d-c current and a-c current that has a d-c component.

(b) By keeping the integral over time of induced voltage near zero, a current transformer is better able to measure unsymmetrical currents without quickly transitioning to saturation.

(c) By reducing the amount that the induction level in the core fluctuates, inaccuracies associated with magnetizing current may be greatly reduced and the accuracy of a current transformer may be greatly improved.

The present invention utilizes voltage pulses to control the magnetization of a magnetic body, rather than a continuously variable voltage (as discussed in the 517 patent). Some background information about how pulsed voltages have been used previously in current-sensing applications will now be presented.

U.S. Pat. No. 3,768,011 to Swain, entitled "Means for Measuring Magnitude and Direction of a Direct Current or Permanent Magnet, Including Clip-On Direct Current Sensing Inductor," enables non-contact DC current measurement utilizing an ordinary clip-on current transformer arrangement. The measurement of DC current is accomplished by continually driving a current transformer magnetic core back and forth between opposite polarities of saturation. The polarity of the voltage pulse is toggled based on the secondary current reaching a magnitude that is sufficient to ensure saturation. The secondary current signal is filtered to remove the saturating peaks, and the filtered signal is representative of the magnitude of the primary current. In this patent, the voltage pulses are simply used to drive a magnetic core to saturation, not to control the magnetization of the core at a level other than saturation. Measurement is limited to DC current.

U.S. Pat. No. 4,274,051 to Condon, entitled "Electromagnetic Arrangement for Measuring Electrical Current," is directed toward the measurement of DC current in telephone systems. Two magnetic cores are utilized, along with multiple windings on each core and a pulsed control signal. Saturating pulses are applied to both cores, and differences in sensed voltages across other windings are used to enable measurement of DC current. In this patent, the voltage pulses are simply used to drive the magnetic cores to saturation, not to control the magnetization of the cores at a level other than saturation.

U.S. Pat. No. 4,278,939 to Henry, entitled "Electromagnetic Arrangement for Measuring Electrical Current," claims to be an improvement of the U.S. Pat. No. 4,274,051 patent listed above. Saturating pulses are applied to both cores, and differences in sensed voltages across other windings are used to determine a DC component. In this patent, the voltage pulses are simply used to drive the magnetic cores to saturation, not to control the magnetization of the cores at a level other than saturation.

U.S. Pat. No. 4,456,875 to Chenier, entitled "Demagnetization Circuit for Current Transformers" applies switched voltages to current transformers to demagnetize them more rapidly and with less power than by utilizing more conventional methods. However, this invention demagnetizes current transformers only while they are out of service. This invention can not be used to control the magnetization of a current transformer core while it is being acted on by other magnetomotive forces (such as a primary current).

U.S. Pat. No. 4,914,383 to Wilkerson, entitled "Non-Contact Ammeter," is another invention that uses voltage pulses to enable non-contact DC current measurement with a magnetic core. This patent discloses alternate control means for controlling the polarity of the voltage pulses. Rather than sensing peak secondary current as an indicator of saturation (to alternate the voltage pulse polarity), this patent uses either a hall-effect sensor embedded in a notch in the core, or a sense winding to sense saturation. With a sense winding, saturation is indicated when the induced voltage drops to zero, at which point the polarity of the voltage pulse is switched. With the hall-effect sensor in a notch, saturation is indicated by a sudden increase of magnetic flux in the notch, which occurs when the unnotched part of the core becomes saturated. Apart from the means of sensing saturation, this invention is similar to others that continually drive a magnetic core back and forth between opposite polarities of saturation. Voltage pulses are simply used to drive the magnetic core to saturation, not to control the magnetization of the core at a level other than saturation.

U.S. Pat. No. 5,008,612 to Otto, entitled "Current Sensor," measures DC and wide-band AC currents by utilizing two distinct transformers in combination. The measurement of a DC current component is accomplished by continually driving a first current transformer magnetic core back and forth between opposite polarities of saturation (similar to many other prior-art DC current sensors). A second transformer is added to measure AC current components. This second current transformer is maintained in a non-saturated state by balancing the DC component of the primary current with an equivalent and opposite DC component in the secondary circuit (as determined using the first transformer). Thus, the second current transformer operates in the usual mode for AC current transformers, and its frequency response is limited only by the usual magnetic core considerations. The result is an AC/DC current sensor having a relatively large frequency response. However, there is a fair amount of noise coupled to the primary circuit due to the cyclic saturation of the first transformer, and the combination of two transformers and associated circuitry tends to be complex and expensive. The patent explains how the noise coupled to the primary may be mitigated by using a third transformer, but this adds still more to the expense and complexity of the current sensor. As in other prior-art DC current sensors, voltage pulses are simply used to drive the transformer core to saturation, not to otherwise control the magnetization of the transformer core.

U.S. Pat. No. 5,053,695 to Canter, entitled "DC Current Monitor," is another invention that purposely saturates a magnetic core to enable non-contact DC current measurement. "A reset current is caused to periodically flow through the secondary coil which produces a magnetic flux oppositely polarized to the flux created by the current in the primary, thus allowing ongoing measurements to be made." The reset current is of such magnitude to ensure saturation. The secondary current is sampled after the reset pulse and after the primary current causes the magnetization of the magnetic core to transition away from saturation. Though this patent speaks of a "reset current" rather than a voltage, the effect of transitioning the core to saturation is similar to other patents. As with previous patents, the magnetic core is purposely driven to saturation, but the magnetization of the core is not effectively controlled otherwise.

U.S. Pat. No. 5,293,121 to Estes, Jr., entitled "Isolated Current Monitoring Circuit for Measuring Direct and High Duty Factor Currents," is another invention that uses voltage pulses to enable non-contact DC current measurement. In this patent, a current transformer is periodically driven to saturation during a first time interval and brought out of saturation during a second time interval. The secondary current is measured during the second time interval. This reduces the amount of noise induced on the primary circuit, relative to devices that drive the transformer core to alternating states of saturation. This invention appears to be applicable only to measuring unipolar DC currents. While, this invention effectively moves the operating point of a magnetic core to a non-saturated state, it does not effectively control the magnetization of the core while it is not saturated.

U.S. Pat. No. 5,811,965 to Gu, entitled "DC and AC Current Sensor Having a Minor-Loop Operated Current Transformer," continuously applies voltage pulses of alternating polarity to a current transformer while it is in service. Like the U.S. Pat. No. 5,811,965, a current transformer core is periodically driven alternately between a saturated state and an unsaturated state. One improvement over the U.S. Pat. No. 5,811,965 patent appears to be that bipolar current measurement is possible, rather than just unipolar measurement. Secondary current is measured at the end of each voltage pulse, and "the sample having the lower absolute value is selected as a sample proportional to line current." In this patent, voltage pulses are used to drive the CT away from saturation, but the magnetization of the CT core is not otherwise controlled so as to remain at a preferred induction level. The pulses merely drive the CT into and out of saturation every two-pulse cycle.

BRIEF SUMMARY OF THE INVENTION

The present invention utilizes an improved controllable voltage device configuration to control the magnetization of a magnetic body. A winding made of conductive material is positioned so as to magnetically couple with the magnetic body. An active voltage source (or an "electric power supply") is switched in and out of the winding circuit using electronic switch means. The induction level of the magnetic body is thereby controlled with voltage pulses from an active voltage source rather than a continuously variable voltage. The voltage pulses may be controlled with a pulse-width-modulation (PWM) type of control (using a constant cycle time and an adjustable duty cycle), or the voltage pulses may vary in a different manner (such as constant pulse width and constant magnitude, with varying time between voltage pulses), depending on the particular application.

For optimal magnetic control, winding current is sensed, and an information signal containing information about winding current is provided to a control circuit. The control circuit receives the information signal and utilizes known characteristics of loop impedances to optimize the voltage pulses for optimal control of the magnetic flux. The magnetic flux is controlled by controlling the induced voltage in the winding, which may be calculated based on the applied voltage pulses, winding current, and impedances of the winding circuit (referred to herein as "loop impedances").

Utilizing voltage pulses from an active voltage source rather than utilizing a continuously variable voltage source has the advantage of lower cost and improved energy efficiency (reduced heat dissipation) for many applications. Improved energy efficiency is largely accomplished by eliminating the energy losses associated with a continuously variable output voltage (a power operational amplifier is utilized in the preferred embodiment of the 517 patent).

The invention can be used with ordinary current transformers to measure electric current for many different applications: a-c current measurement, d-c current measurement, measurement of a-c current having a d-c component, measurement of pulsed current, and for measurement of electric power and energy.

The switched-voltage control that is disclosed also may be used to facilitate electronic measurement of a-c current in a self-powered manner, with the power supply for the electronics receiving energy from the current transformer secondary circuit. The electronic switch means can be controlled so that the power supply is periodically charged, then controlled to actively demagnetize the current transformer for periodic sampling of the current waveform. This differs from self-powered configurations disclosed in the 517 patent in that the present invention uses an active voltage source for demagnetizing the current transformer, rather than an adjustable impedance. Also, the present invention can implement burden compensation during the current sampling period for improved accuracy, which cannot be done with adjustable impedances.

DETAILED DESCRIPTION OF THE DRAWINGS

Figure 1:
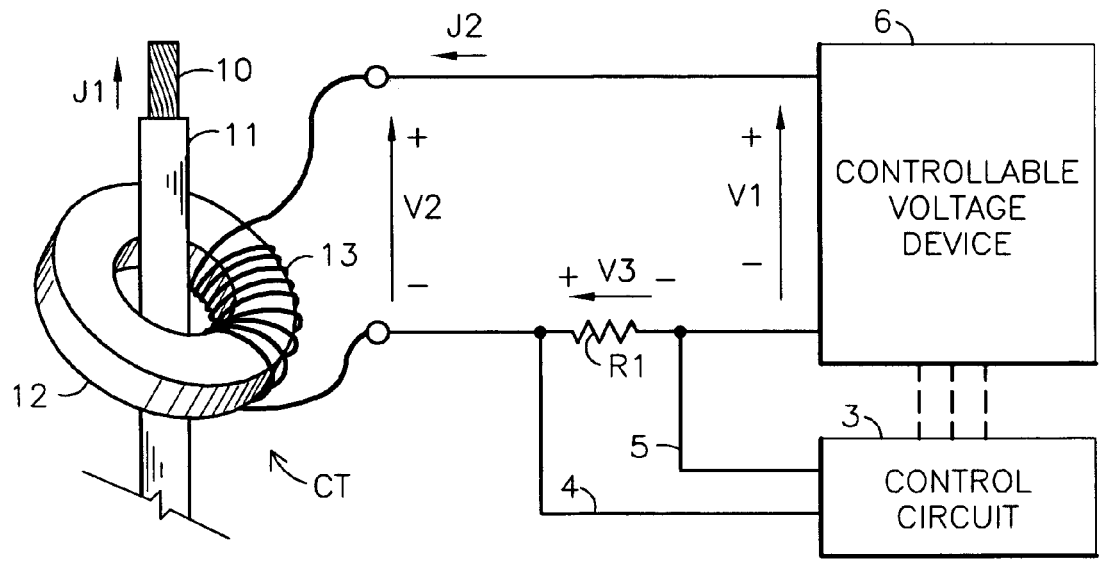
FIG. 1 illustrates the general configuration of the prior art (this figure is similar to FIG. 1 of the 517 patent).

FIG. 1 illustrates the prior art. FIG. 1 is similar to FIG. 1 of the 517 patent. A magnetic body 12 is wrapped with a winding 13. Magnetic body 12 and winding 13 are shown in a typical current transformer configuration designated as current transformer CT. In this arrangement, magnetic body 12 may be referred to as a magnetic core, and winding 13 may be referred to as a secondary winding.

Speaking generally of magnetic bodies and windings, winding 13 comprises one or more turns of conductive material positioned relative to magnetic body 12 in such a way that a change of magnetic flux in the magnetic body is associated with an induced voltage across winding 13; the induced voltage being proportional to a rate of change of the magnetic flux.

An electric power system conductor 10 has an insulating covering 11. Power system conductor 10 functions as a primary winding of current transformer CT, with only one turn, with a primary current J1 flowing. Though shown with one end disconnected, power system conductor 10 is normally connected as part of an electric power system.

For clarity, current transformer CT comprises a magnetic core 12 and a secondary winding 13 magnetically coupled to magnetic core 12; a primary (or "first") electric current J1 flows in conductor 10 which is configured as a primary winding of current transformer CT; a secondary electric current J2 flows in secondary winding 13; secondary electric current J2 is generally proportionally smaller than primary electric current J1 by a turns ratio of current transformer CT. (Generally speaking, if a current transformer secondary current is known, then the primary current is calculable as the secondary current multiplied by the turns ratio of a current transformer).

A secondary electric current error is related to a build-up of a magnetic flux in magnetic core 12. For purposes of this disclosure, "secondary electric current error" is the instantaneous difference between the actual secondary electric current (J2) and an ideal secondary electric current calculated as the instantaneous primary electric current (J1) divided by the turns ratio of the current transformer (CT).

A controllable voltage device 6 is controlled by a control circuit 3.

Resistor R1 is a current-sensing resistor with low resistance, and may be thought of as one possible embodiment of a "current-sensing means." Voltage V3 is proportional to secondary electric current J2, and may be considered to be an information signal that contains information about secondary electric current J2. Resistor R1 functions as a current-sensing means for sensing secondary electric current J2 and provides an information signal containing information about secondary electric current J2. The information signal may be communicated to a larger monitoring system in many applications.

As shown in FIG. 1, winding 13, voltage device 6, and resistor R1 are connected in series, so that current J2 flows through each of them.

Winding 13 is shown with ten turns around magnetic body 12. The actual number of turns may vary widely depending on the application. Magnetic body 12 is shown as a toroid, though wide variation in magnetic body configurations is possible and the illustration is not intended to limit the breadth of application of the invention.

Control circuit 3 is shown with two high-impedance voltage-sensing inputs (connected to conductors 4, and 5) to enable sensing of voltage V3. Voltage V3 across resistor R1 is proportional to current J2. Voltage V2 is the voltage across winding 13, which is the induced voltage generated by changing flux in magnetic body 12 plus any voltage drop associated with current J2 flowing through stray winding impedances. Often, the voltage drop associated with current J2 flowing through stray winding impedances is small compared to the induced voltage and may be ignored in some applications. Voltage V1 is the adjustable output voltage of controllable voltage device 6.

In the example of FIG. 1, magnetic body 12 provides a closed magnetic path with no need for other magnetic components.

Figure 2:
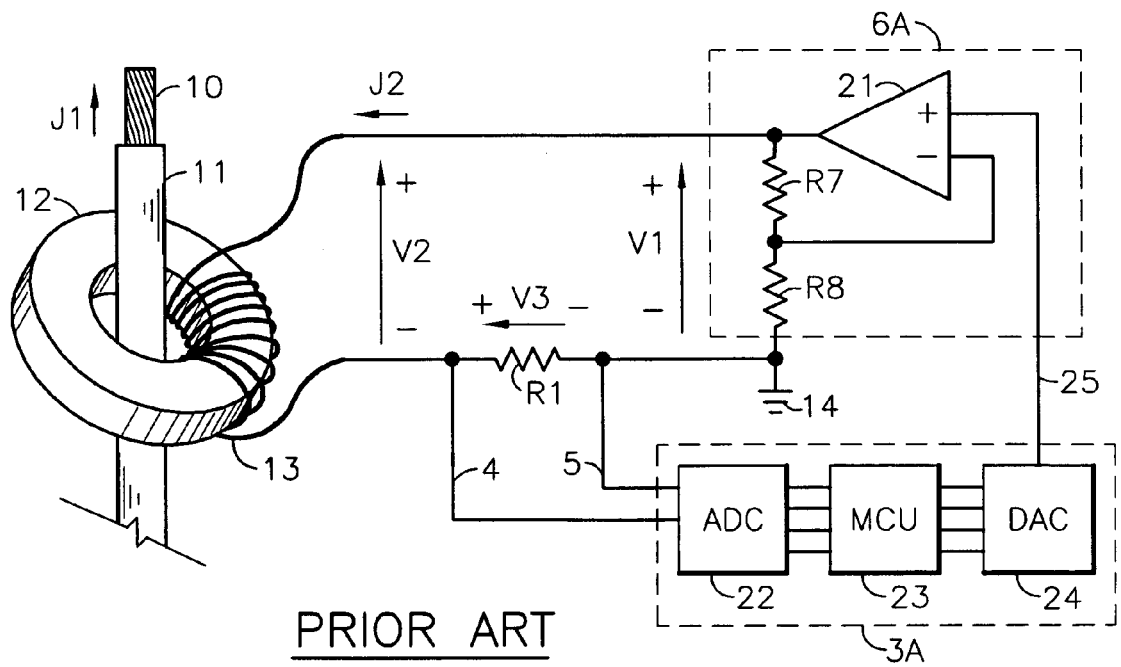
FIG. 2 illustrates the preferred embodiment of the controllable voltage device of the prior art (this figure is similar to FIG. 21 of the 517 patent).

FIG. 2 shows a prior-art embodiment of control circuit 3 and voltage device 6 of FIG. 1. FIG. 2 is similar to FIG. 21 of the 517 patent. The configuration shown is particularly suitable for measuring electric current, including d-c current. Many components are the same as FIG. 1, and these components function in the manner previously described.

Control circuit 3A has an analog-to-digital converter circuit 22 to sense current J2 (as voltage V3 across resistor R1), a microcontroller 23 for data processing and control functions, and a digital-to-analog converter circuit 24. Digital-to-analog converter circuit 24 provides an analog voltage signal on conductor 25 that controls the voltage output of voltage device 6A. Analog-to-digital converter circuit 22 and microcontroller 23 communicate via an interface shown as four conductors, and this interface may vary considerably depending on the particular design. Likewise microcontroller 23 communicates with digital-to-analog converter circuit 24 via an interface that may vary considerably depending on the particular design. Alternately, the analog-to-digital converter and digital-to-analog converter may be part of the microcontroller. Voltage device 6A has an operational amplifier 21, with resistors R7 and R8 configured to set the gain of operational amplifier 21. A separate power source (not shown) provides operating power for analog-to-digital converter circuit 22, microcontroller 23, digital-to-analog converter circuit 24, and operational amplifier 21.

Ground connection 14 provides a common reference potential for the various circuits and power supply. If a particular application requires that winding 13 be directly grounded on one side, then resistor R1 may be relocated and connected in series with the opposite side of winding 13. This complicates the measurement of voltage V3 across resistor R1 somewhat, but prior-art differential voltage measurement methods are adequate.

Operational amplifier 21 must be able to produce voltage in a circuit with relatively large current driven by a current source (a current transformer acts like a current source). A "power operational amplifier" will usually be required, as discussed in the 517 patent.

The type of control configuration shown in FIG. 2 (utilizing an analog-to-digital converter circuit to sense an input signal, a microcontroller to implement a control function based on the input signal, a digital-to-analog converter to produce an analog control signal, and an operational amplifier to produce a voltage proportional to the analog control signal) is well established in the prior art, so additional configuration details will not be described herein. Microcontroller 23 may be configured to implement the control sequences illustrated and discussed in the 517 patent.

Figure 3:
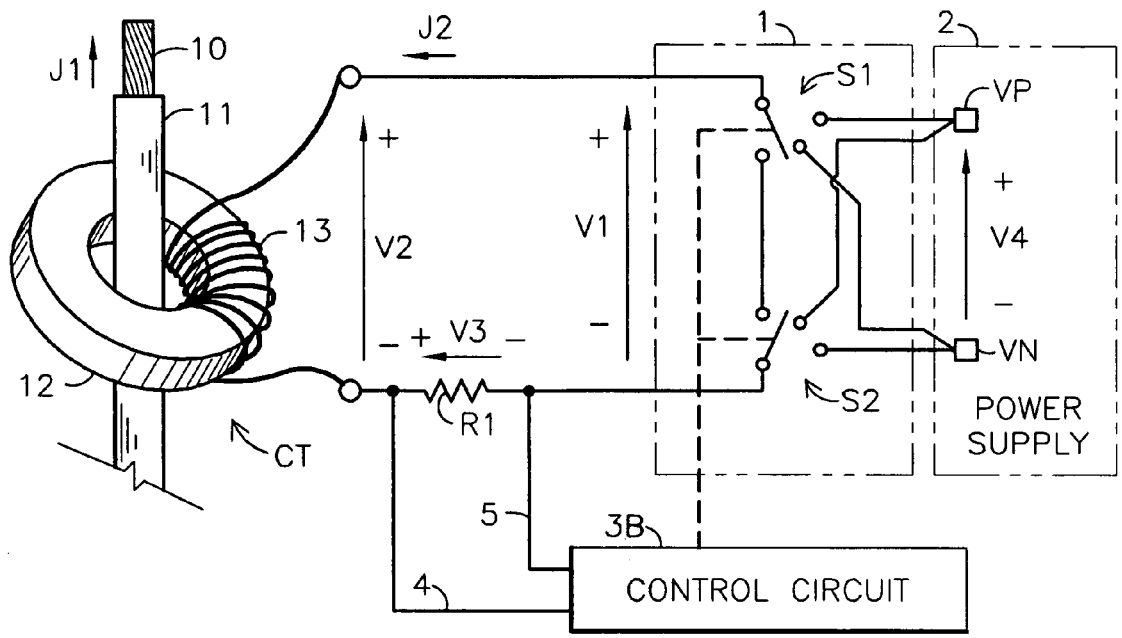
FIG. 3 illustrates an improved controllable voltage device according to the present invention. The controllable voltage device comprises a power supply 2 and an electronic switch means 1.

FIG. 3 illustrates the use of a power supply 2 and electronic switch means 1 as a controllable voltage device, according to the present invention. Power supply 2 provides a single d-c (direct-current) voltage output V4 across two terminals: terminal VP, which has a positive polarity relative to a second terminal VN. In the configuration shown, the output of power supply 2 does not have any common connection with the rest of the circuit, so that output voltage V4 can be applied so as to result in a positive or negative polarity at the output of an electronic switch means 1. That is to say, that aside from connections made by electronic switches S1 and S2, the power supply output is isolated from the rest of the circuit.

Electronic switch means 1 functionally comprises two single-pole triple-throw switches which operate in tandem as controlled by a control circuit 3B. Electronic switches S1 and S2 operate simultaneously to cause voltage V1 to have one of three values: voltage V1 having positive polarity equal in magnitude to power supply voltage V4, voltage V1 having negative polarity and equal in magnitude to power supply voltage V4, and voltage V1 having a magnitude of approximately zero volts (power supply 2 not connected).

Stated another way, electronic switch means 1 periodically connects power supply output voltage V4 in series with secondary electric current J2. Electronic switch means 1 also provides a low-impedance path for secondary current J2 during time periods that power supply 2 is not connected in series with secondary current J2. Electronic switch means 1 and power supply 2 are configured to provide both positive voltage and negative voltage connected in series with secondary electric current J2, the positive voltage and negative voltage being connected one at a time.

Power supply 2 and electronic switch means 1 operate together to provide an adjustable output voltage (V1) that is effectively a pulsed voltage.

Speaking of magnetic control applications in general, the rate of change of magnetic flux in magnetic body 12 is proportional to the voltage induced in winding 13. Generally speaking, control circuit 3B controls the voltage pulses at voltage V1 so that the average value over time of the sum of voltage V1 pulses and of voltage drops associated with secondary electric current J2 flowing through loop impedances is approximately equal to the preferred induced voltage, thereby causing the rate of change of magnetic flux to be the preferred value.

When using the term "average value over time," the time period over which the averaging occurs is significant. In the context of induced voltage calculations within this disclosure, this period of time is preferably equal to the length of time of an integral number of complete voltage pulse cycles (including any off time that is part of a full cycle). A time period spanning only one voltage pulse cycle will generally provide the most accurate control.

For optimal control, control circuit 3B utilizes characteristics of loop impedances through which secondary electric current J2 flows to optimize the control of electronic switch means 1 for improved control of the induction level of magnetic body 12. Control circuit 3B uses information signal V3 along with known characteristics of loop impedances to calculate the induced voltage generated in winding 13 by flux changes in magnetic core 12. The voltage pulses at voltage V1 are controlled so that the average value of the voltage induced in the winding is the preferred value.

In FIG. 3, the loop impedances include stray impedances associated with winding 13, stray impedances in various connecting wires, and the impedance of current-sensing resistor R1.

For many applications it is desirable to minimize flux variations, in which case control circuit 3B is configured to cause the average value over time of voltage V1 pulses to be approximately equal to, and have opposite polarity as, the sum of voltage drops associated with current J2 flowing through loop impedances, thereby causing the average value of induced voltage to be near zero, thereby minimizing flux changes. This type of control is illustrated by FIGS. 7A to 7E (discussed below).

Speaking now of current transformer applications, control circuit 3B receives voltage V3 (which is an information signal containing information about secondary electric current J2) and uses this information for controlling electronic switch means 1 in such a way as to control changes of magnetic flux in magnetic body 12, thereby reducing the secondary current error, whereby secondary electric current J2 is caused to be more accurately proportional to primary electric current J1. Control circuit 3B operates while current transformer CT is in service.

Figure 4:
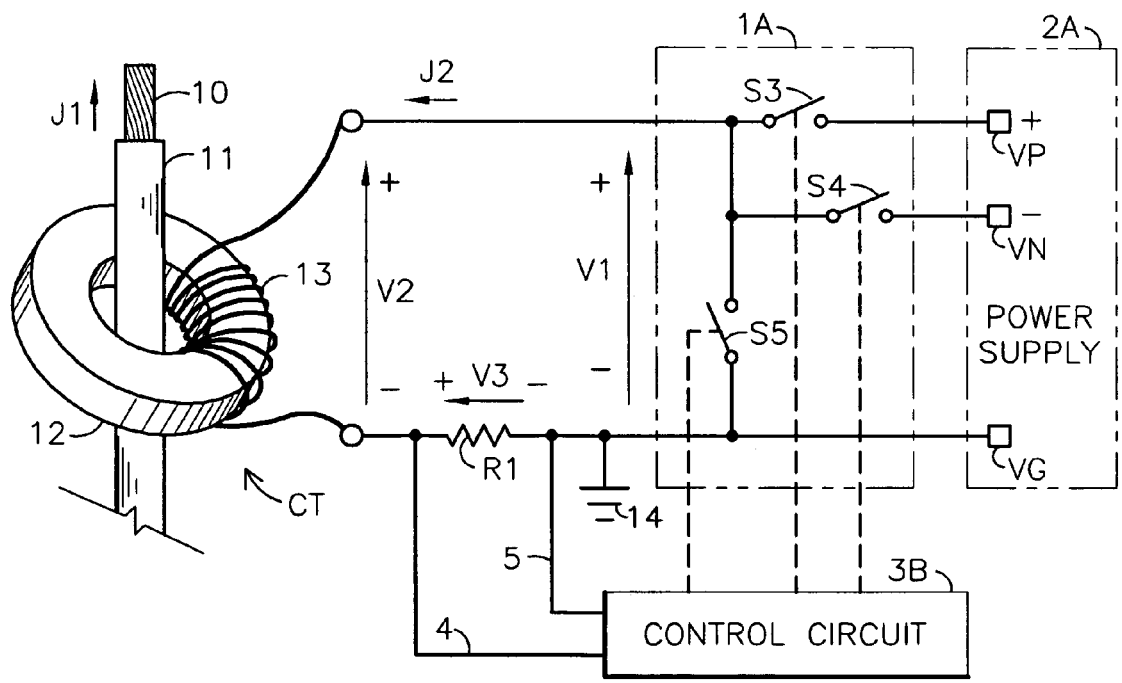
FIG. 4 illustrates a configuration for a power supply 2A and an electronic switch means 1A that is easier to realize than the configuration shown in FIG. 3.

FIG. 4 illustrates a development of FIG. 3 in which power supply 2A has two voltage outputs relative to a common terminal VG. A positive d-c voltage is available at terminal VP, and a negative d-c voltage is available at terminal VN. Switch means 1A is now somewhat simplified (compared to FIG. 3), utilizing three single-pole single-throw electronic switches S3, S4, and S5. The configuration of FIG. 4 is functionally similar to the configuration of FIG. 3, but is easier to realize in practice, since the electronic switches are considerably simpler and the power supply no longer requires an isolated output.

In the configuration of FIG. 4 electronic switch means 1A still provides just three values for output voltage V1. With just electronic switch S3 closed, voltage V1 has positive polarity equal to the voltage provided by power supply terminal VP. With just electronic switch S4 closed, voltage V1 has negative polarity equal to the voltage provided by power supply terminal VN. With just electronic switch S5 closed, a low-impedance path is provided for current J2, and voltage V1 is approximately zero volts. Only one switch is normally closed at a time. For most applications, the voltage magnitude of the power supply positive and negative d-c voltage outputs will be approximately equal. An optional ground connection 14 provides a reference voltage level for the circuit.

FIGS. 5A to 5E illustrate the magnetic operation of an ordinary prior-art current transformer without electronic assist (this is functionally similar to the configuration of FIG. 4 if electronic switch S5 is continually closed). The waveforms are based on the current transformer operating in sinusoidal steady-state conditions at time T1. Time T2 is a reference mark for waveform comparison. Time T4 marks the time that the current transformer magnetic core saturates due to the d-c primary current.

Figure 5A:
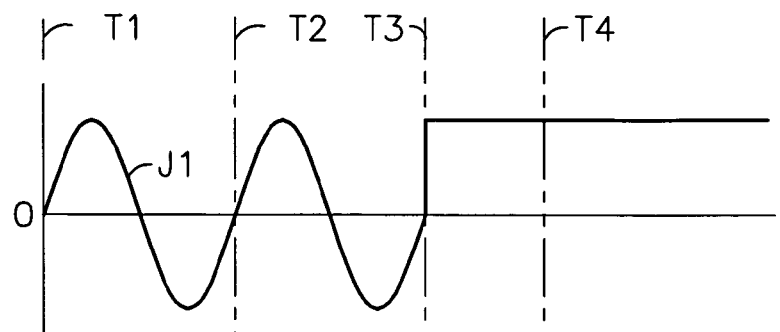
FIGS. 5A to 5E illustrate waveforms associated with prior-art ordinary current transformer operation, with no electronic assist.
Figure 6A:
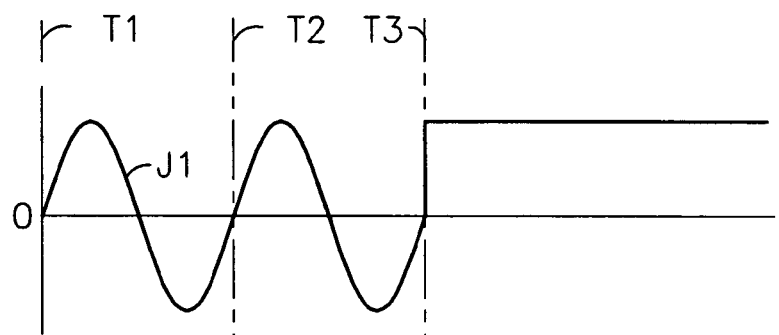
FIGS. 6A to 6E illustrate waveforms associated with prior-art current transformer operation with electronic assist. These waveforms are applicable to the type of prior-art electronic assist shown in FIG. 2.
Figure 7A:
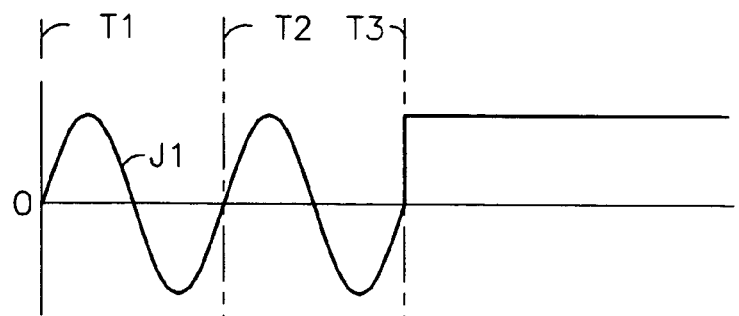
FIGS. 7A to 7E illustrate waveforms that are representative of the present invention. These waveforms are applicable to the circuit configurations shown in FIGS. 3, 4, 8 and 9.

FIG. 5A illustrates one possible primary current waveform for primary current J1. This is the same reference waveform as shown in FIGS. 6A and 7A. The waveform is simply a sinusoid for two cycles, then changes to a positive d-c current at time T3.

Figure 5B:
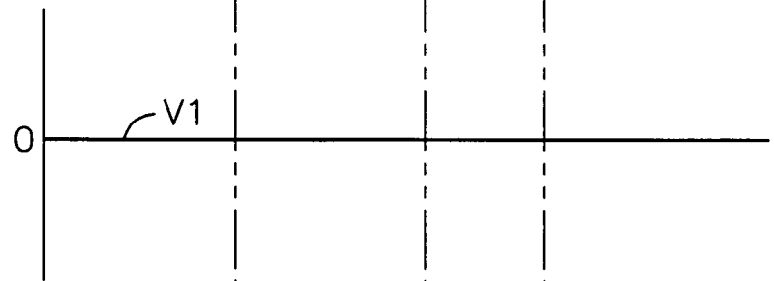

FIG. 5B simply illustrates that voltage V1 is continuously zero for an ordinary current transformer without electronic assist.

Figure 5C:
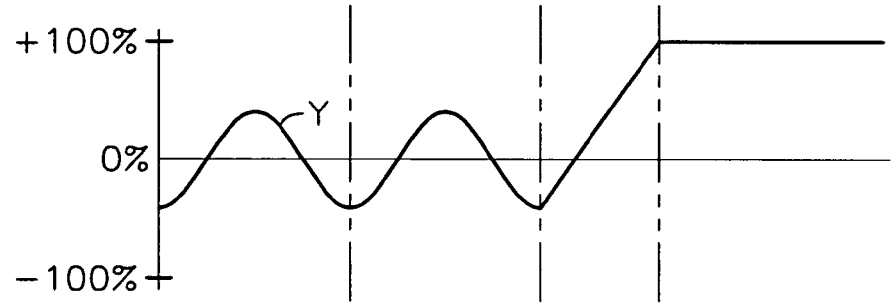

FIG. 5C illustrates the magnetic flux density waveform Y (of magnetic core 12), with the vertical axis scaled linearly from −100% (negative saturation) to +100% (positive saturation). The current transformer burden is assumed to be resistive, so flux waveform Y is 90 degrees out-of-phase with primary current J1 (FIG. 5A) while primary current J1 is sinusoidal. The magnetic core is seen to quickly saturate when primary current J1 changes to a d-c current.

Figure 5D:
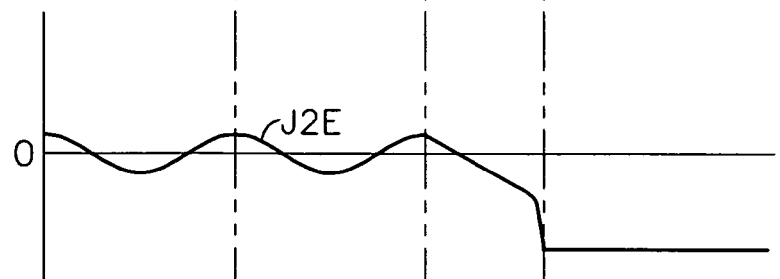

FIG. 5D illustrates the waveform of the secondary electric current error J2E. The current error J2E is relatively large (when compared to FIGS. 6D and 7D with electronic assist). The error becomes 100% at time T4 when the current transformer core saturates.

Figure 5E:
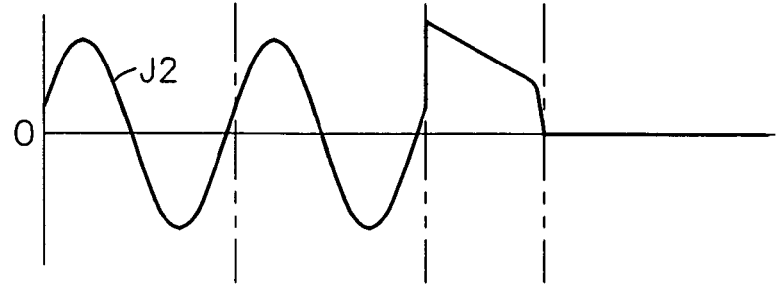

FIG. 5E illustrates the waveform of secondary electric current J2. The effects of secondary current error J2E are fairly clear: the sinusoidal waveform is time shifted relative to primary current J1, and the current transformer is unable to maintain a d-c current output.

FIGS. 6A to 6E illustrate the magnetic operation of a prior-art current transformer with electronic assist (this is functionally similar to the configuration of FIG. 2 if control circuit 3A operates to compensate for secondary burden).

FIG. 6A illustrates one possible primary current waveform for primary current J1. This is the same reference waveform as shown in FIGS. 5A and 7A.

Figure 6B:
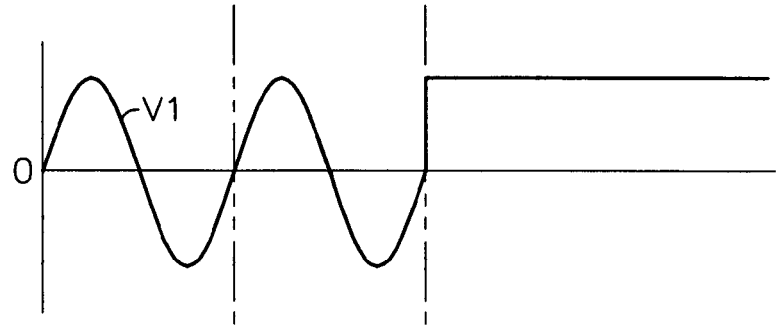

FIG. 6B simply illustrates that voltage V1 is continuously controlled to compensate for secondary burden. Since the burden (the sum of all loop impedances) is assumed to be resistive, voltage V1 has a waveform that is virtually the same as secondary current J2 (FIG. 6E), which, due to the accuracy of the assisted current transformer, is virtually the same waveform as primary current J1 (FIG. 6A).

Figure 6C:
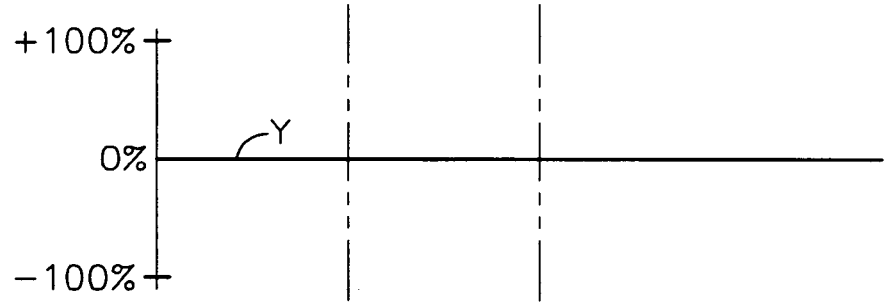

FIG. 6C illustrates the magnetic flux density waveform Y (of magnetic core 12), with the vertical axis scaled linearly from −100% (negative saturation) to +100% (positive saturation). Ideal burden compensation is assumed, so the flux density remains very close to zero.

Figure 6D:
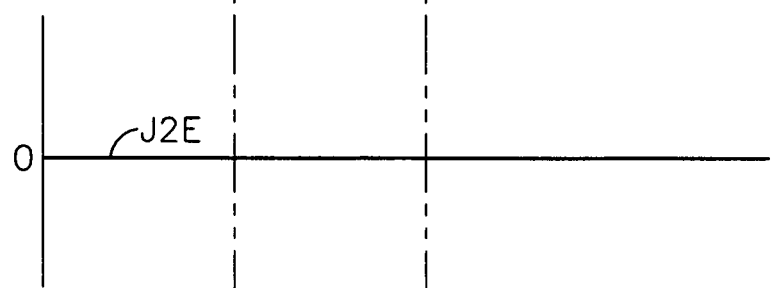

FIG. 6D illustrates the waveform of the secondary electric current error J2E. Since secondary current error J2E is closely related to the magnetic flux density Y of the magnetic core, and the flux density remains near zero as shown in FIG. 6C, current error J2E is near zero.

Figure 6E:
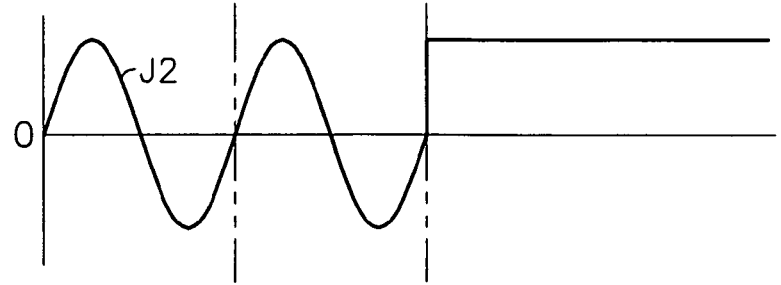

FIG. 6E illustrates the waveform of secondary electric current J2. Since secondary current error J2E is near zero, the waveform of secondary current J2 is almost identical to primary current J1 (though secondary current J2 is smaller than primary current J1 by the turns ratio of current transformer CT).

FIGS. 7A to 7E illustrate one mode of magnetic operation of the present invention when applied to a current transformer. The waveforms are applicable to the circuit configurations shown in FIGS. 3, 4, 8 and 9.

FIG. 7A illustrates one possible primary current waveform for primary current J1. This is the same reference waveform as shown in FIGS. 5A and 6A.

Figure 7B:
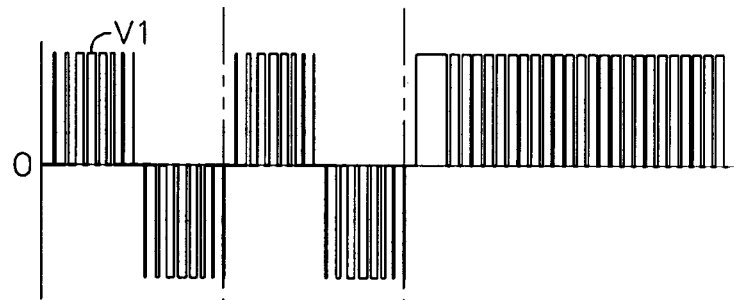

FIG. 7B illustrates that voltage V1 is now controlled with a pulse-width-modulated type of control to compensate for secondary burden. Control circuit 3B controls voltage V1 so that its average value over a brief period of time is approximately equal to the continuous voltage shown in FIG. 6B. The pulse frequency shown was chosen for illustrative purposes; it is normally advantageous to have a pulse frequency that is fast relative to the highest frequency that is to be measured. The relatively slow pulse frequency shown exemplifies a small time lag that is inherent in a PWM control response; this is most visible immediately after time T3.

Figure 7C:
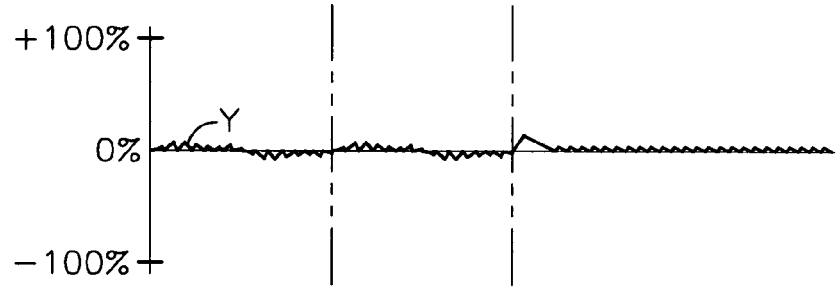

FIG. 7C illustrates the magnetic flux density waveform Y (of magnetic core 12), with the vertical axis scaled linearly from −100% (negative saturation) to +100% (positive saturation). The pulse-width-modulated voltage output provides burden compensation that is somewhat less than ideal, which results in a somewhat jagged flux waveform. However, flux still remains relatively close to zero, and the flux control is still good.

Figure 7D:
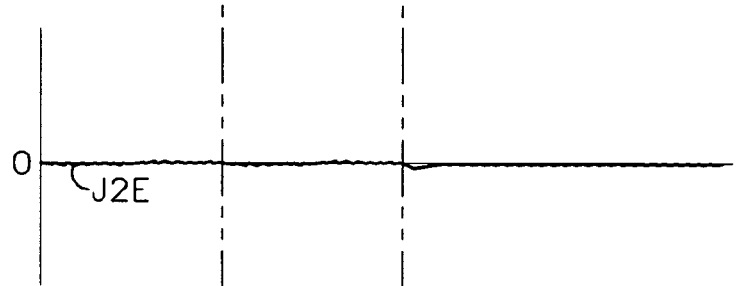

FIG. 7D illustrates the waveform of the secondary electric current error J2E. Since secondary current error J2E is closely related to the magnetic flux density Y of the magnetic core (and the magnetic core does not saturate), current error J2E has a waveform that is similar to the waveform of magnetic flux Y. The current error waveform J2E is seen to be very small relative to the waveform of FIG. 5D (the case of the uncompensated current transformer).

Figure 7E:
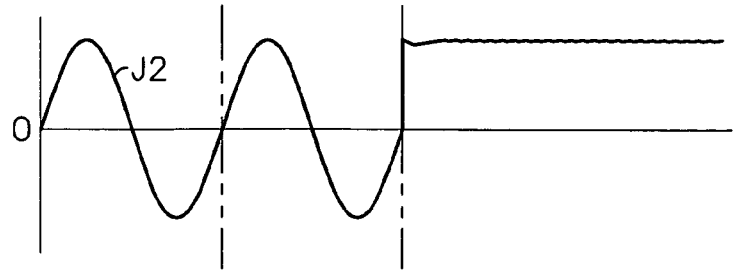

FIG. 7E illustrates the waveform of secondary electric current J2. Since secondary current error J2E is very small, the waveform of secondary current J2 is almost identical to primary current J1.

FIGS. 7A to 7E illustrate how the present invention utilizes voltage pulses to approximate the "burden reducing" compensation described in the 517 patent. Using similar principles, the present invention can be utilized to approximate other operating modes described in the 517 patent:

(a) The induction level of a magnetic body may be caused to transition from a known induction level to a preferred induction level. (A preferred induction level of zero may be chosen to demagnetize a magnetic body).

(b) When the induction level is not known, a preferred induction level may be established by changing the induction level of the magnetic body from an unknown induction level to a known induction level and then to the preferred induction level.

(c) A preferred induction level may be maintained by causing the induced voltage across the winding to have an average value near zero (or by causing the integral of induced voltage to not exceed a predetermined value).

(d) The induction level may be made to vary with time in a preferred manner, including matching a control signal that is proportional to a reference induction level.

Figure 8:
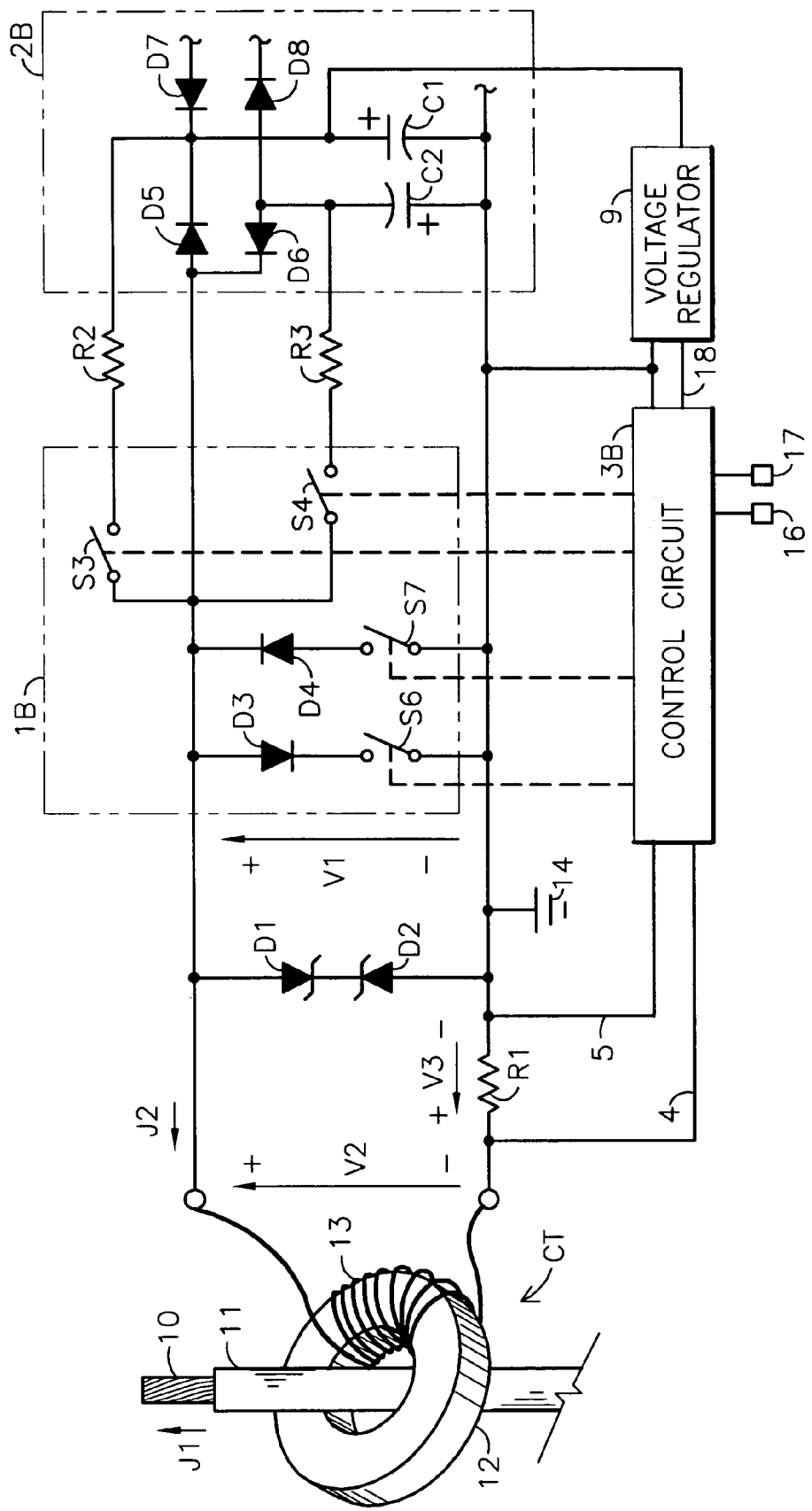
FIG. 8 is a further development of the invention, showing more details of a preferred embodiment of power supply 2B and electronic switching means 1B.

FIG. 8 is a further development of the invention shown in FIG. 4. An electronic switch means 1B now has two electronic switches S6 and S7 and two diodes D3 and D4 in place of electronic switch S5 (of FIG. 4). Using these two switches and two diodes facilitates the operation of electronic switch means 1B by enabling voltage pulses to be controlled by opening and closing only a single switch for any given polarity of secondary current J2. For example, if secondary current J2 is positive, then electronic switch S7 can remain closed while electronic switch S3 is cycled to produce the appropriate positive voltage pulses. When secondary current J2 goes negative, then switch S6 is closed, switch S7 is opened, and switch S4 may be cycled to produce the appropriate negative voltage pulses.

Power supply 2B is shown to have two capacitors C1 and C2 near its outputs, and diodes D5 and D6 have been added so that the power supply capacitors can be charged periodically by secondary current J2 (with all electronic switches open, the power supply receives energy from secondary current J2). This enables the configuration to operate in a self-powered manner for applications in which primary current J1 is an alternating current. With this configuration, no other source of operating power is necessary (though operation may be improved with an alternate source of operating power).

Diodes D7 and D8 are included to prevent backfeeding an optional connection to an alternate source of operating power.

Resistors R2 and R3 have been added to limit the magnitude of the current draw on the power supply should the current transformer become saturated. A voltage regulator 9 provides regulated positive voltage to control circuit 3B on conductor 18.

Zener diodes D1 and D2 provide a current path during switching transients (if all switches are open momentarily) and provide a voltage limit for charging of capacitors C1 and C2 for self-powered operation.

Terminals 16 and 17 are included to show that an optional communication output from control circuit 3B may be provided to other equipment. This output may be any form of information signal, including analog or digital, hardwired or radio waves, optical fiber or infrared, etc. The information contained may relate to the characteristics of primary current J1, or the magnetic state of magnetic body 12, or any other information that control circuit 3B may have access to. A specific example is a 4 to 20 milliamp output signal that correlates to the RMS magnitude of primary current J1.

Figure 9:
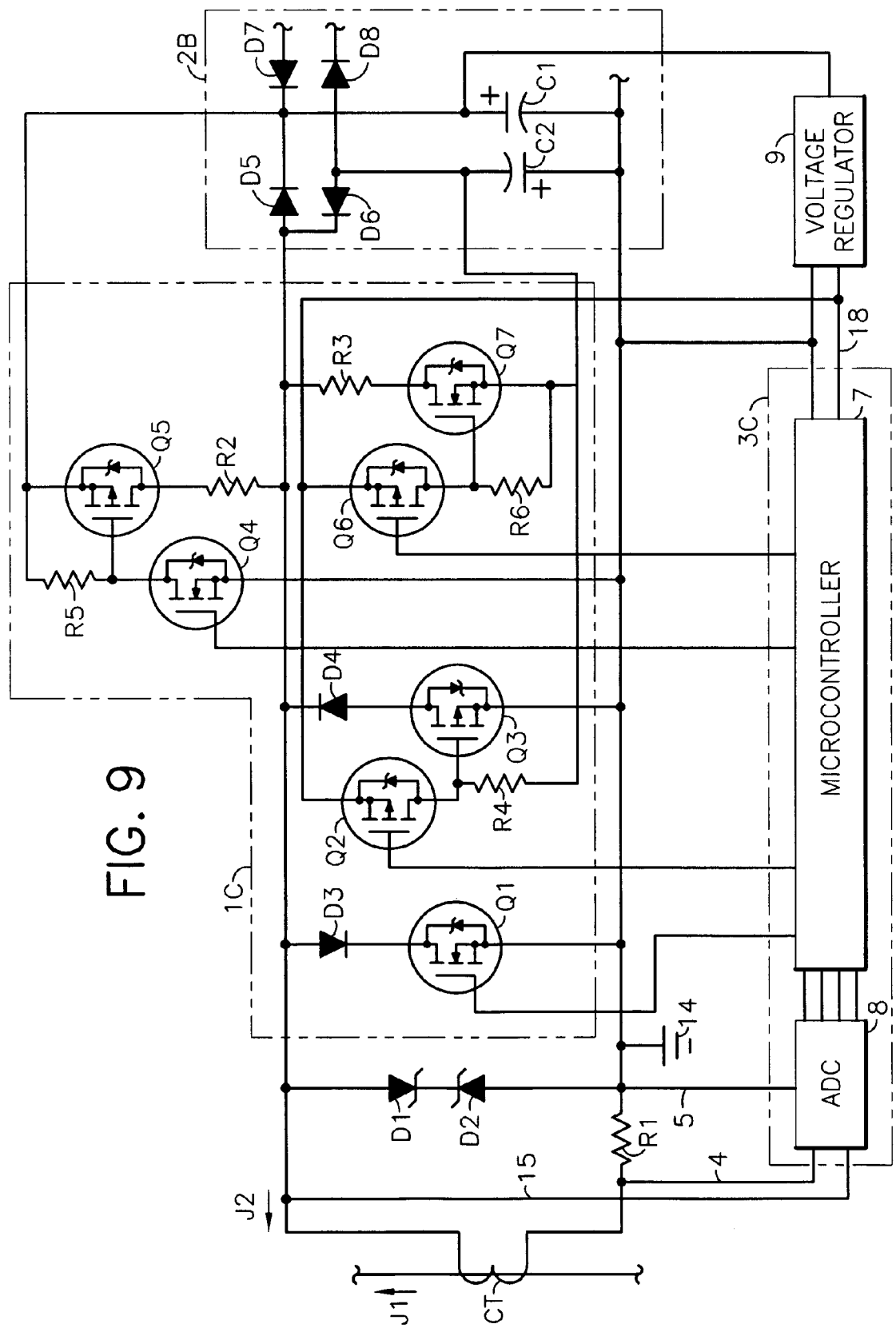
FIG. 9 is a further development of the invention, showing how the electronic switches of FIG. 8 can be realized utilizing MOSFET transistors, and how the control circuit can be realized utilizing a microcontroller 7 and an analog-to-digital converter circuit 8.

The configuration shown in FIG. 9 is functionally similar to the configuration of FIG. 8. However, FIG. 9 shows details of how the electronic switches and control circuit of FIG. 8 may be realized by utilizing MOSFET transistors, a microcontroller 7, and an analog-to-digital converter circuit 8. Current transformer CT is now shown as a symbol rather than a physical diagram. Analog-to-digital converter circuit 8 has an additional input connection 15 from the secondary winding of current transformer CT. This optional connection provides a means to measure the actual voltage applied to current transformer CT for improved calculation accuracy (which may be important if power supply 2B has poor regulation).

In FIG. 9, electronic switch means 1C includes MOSFET transistors Q1, Q4, and Q7 (which are N-channel enhancement-mode devices) and MOSFET transistors Q2, Q3, Q5 and Q6 (which are P-channel enhancement-mode devices). Transistors Q2, Q4, and Q6 and resistors R4, R5, and R6 are included to provide proper gate-driving voltages for transistors Q3, Q5, and Q7 respectively. Transistors Q1, Q2, Q4, and Q6 have sensitive gates for direct control by microcontroller 7 outputs. While the preferred embodiment of the invention utilizes MOSFET transistors, it should be understood that any type of transistors or other electronic switches may be utilized to embody the invention.

Finally, for purposes of clarifying the claims, the word "apparatus" has its usual meaning: a set of material or equipment designed for a particular use.

While several embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. A method for controlling a magnetic flux in a magnetic body; said magnetic body being positioned relative to a conductive winding in such a way that a change of said magnetic flux is associated with an induced voltage across said winding; said induced voltage being proportional to a rate of change of said magnetic flux; said winding conducting an electric current; said method comprising the control of a voltage device connected to said winding; said voltage device producing an adjustable output voltage that controls said induced voltage, thereby controlling said rate of change of said magnetic flux; said adjustable output voltage causing said induced voltage to have such waveform and magnitude so as to be approximately proportional to a preferred rate of change of said magnetic flux; an instantaneous magnitude of said induced voltage differing from an instantaneous magnitude of said adjustable output voltage because of voltage drops associated with said electric current flowing through loop impedances; said method utilizing a parameter related to said electric current and characteristics of said loop impedances to control said adjustable output voltage so as to compensate for said voltage drops, thereby optimizing said adjustable output voltage for optimal control of said magnetic flux;

wherein the improvement is in the control of said voltage device, said voltage device comprising an electric power supply means for providing one or more d-c voltage outputs, and an electronic switch means for periodically connecting said one or more d-c voltage outputs in series with said winding, said adjustable output voltage thereby being a pulsed voltage; said method further controlling said electronic switch means so that an average value over time of said induced voltage is approximately proportional to said preferred rate of change of said magnetic flux, thereby effecting control of said magnetic flux; whereby an energy efficiency of said method is improved.

2. The method of claim 1 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said method being used to control said magnetic flux in such a way that said electric current is more accurately proportional to said primary electric current than would be the case without said method.

3. The method of claim 2 wherein said method is utilized while said current transformer is in service, said primary electric current having a nonzero magnitude.

4. The method of claim 3 wherein an accuracy of said current transformer is improved by reducing an amount that said magnetic flux fluctuates; said induced voltage and associated fluctuation of said magnetic flux adversely affecting said accuracy of said current transformer; said adjustable output voltage being controlled in such a way that said average value over time of said induced voltage is reduced, thereby reducing said amount that said magnetic flux fluctuates, thereby improving said accuracy of said current transformer.

5. The method of claim 3 wherein an accuracy of said current transformer is improved by causing an induction level of said magnetic core to transition to a preferred induction level; said adjustable output voltage being controlled during a first phase so as to cause said induction level to transition to a determinate induction level; said adjustable output voltage being controlled during a second phase so as to cause said induced voltage to have such waveform, magnitude and duration that a value of an integral over time of said induced voltage is approximately equal to a volt-time value corresponding to a change in said induction level from said determinate induction level to said preferred induction level, thereby causing said induction level to transition from said determinate induction level to said preferred induction level; said adjustable output voltage being controlled during a third phase so as to allow said electric current to flow freely; said electric current being approximately proportional to said primary electric current during said third phase.

6. The method of claim 5 wherein said accuracy of said current transformer is further improved by further using said method to reduce an amount that said induction level fluctuates during said third phase; said induced voltage and associated fluctuation of said induction level adversely affecting said accuracy of said current transformer; said adjustable output voltage being controlled in such a way during said third phase that said average value over time of said induced voltage is reduced, thereby reducing said amount that said induction level fluctuates, thereby improving said accuracy of said current transformer.

7. The method of claim 6 wherein said primary electric current is a direct current; said electric current being approximately proportional to said primary electric current during said third phase.

8. Apparatus for controlling a magnetic flux in a magnetic body; a winding being positioned relative to said magnetic body in such a way that a rate of change of said magnetic flux is proportional to an induced voltage across said winding, said winding comprising one or more turns of conductive material; said apparatus comprising (a) a current-sensing means for providing an information signal containing information about an electric current flowing in said winding;

(b) a controllable voltage device connected to said winding, said voltage device producing an adjustable output voltage which controls said induced voltage and thereby controls said rate of change of said magnetic flux; and (c) a suitable control means for receiving said information signal and controlling said voltage device; said control means utilizing said information signal and characteristics of loop impedances through which said electric current flows to optimize said adjustable output voltage for optimal control of said magnetic flux;

wherein the improvement is that said controllable voltage device comprises an electric power supply means for providing one or more d-c voltage outputs, and an electronic switch means for periodically connecting said one or more d-c voltage outputs in series with said electric current, said adjustable output voltage thereby being a pulsed voltage; whereby an energy efficiency of said apparatus is improved.

9. The apparatus of claim 8 wherein said induced voltage is approximately equal to a sum of said pulsed voltage and of voltage drops associated with said electric current flowing through said loop impedances; said control means further controlling said electronic switch means so that an average value over time of said induced voltage is approximately equal to a preferred value, thereby effecting control of said magnetic flux.

10. The apparatus of claim 8 wherein said electronic switch means further is capable of providing a low-impedance path for said electric current during time periods that said power supply is not connected in series with said electric current.

11. The apparatus of claim 10 wherein said switch means and said power supply are configured to provide both positive voltage and negative voltage connected in series with said electric current, said positive voltage and said negative voltage being connected one at a time.

12. The apparatus of claim 8 wherein said control means further controls said electronic switch means with a pulse-width-modulation type of control.

13. The apparatus of claim 8 wherein said power supply is configured so as to receive energy from said electric current, said apparatus thereby requiring no other source of operating power.

14. The apparatus of claim 8 wherein said current-sensing means comprises a current-sensing resistor connected in series with said electric current; said electronic switch means comprises a plurality of electronic transistors; and said control means comprises a microcontroller and an analog-to-digital converter; said analog-to-digital converter being connected to said current-sensing resistor; said information signal being a voltage signal across said current-sensing resistor, said voltage signal being proportional to said electric current; said analog-to-digital converter receiving said voltage signal and providing a digital signal to said microcontroller; said plurality of electronic transistors being connected to said power supply and to said winding and to said microcontroller in such a way as to enable periodic connection of said one or more d-c voltage outputs in series with said electric current.

15. The apparatus of claim 8 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said apparatus being used to control said magnetic flux in such a way that said electric current is more accurately proportional to said primary electric current than would be the case without said apparatus.

16. The apparatus of claim 15 wherein said primary electric current is an a-c electric current, and said apparatus primarily functions to reduce a fluctuation of said magnetic flux, thereby causing said electric current to be more accurately proportional to said primary electric current.

17. The apparatus of claim 15 wherein said primary electric current is a d-c electric current, and said apparatus functions to cause said magnetic core to not be saturated, thereby enabling measurement of said d-c electric current.

18. The apparatus of claim 15 wherein said primary electric current is an a-c electric current having a d-c electric current component, and said apparatus functions to cause said magnetic core to not be saturated by said d-c electric current component, thereby enabling accurate measurement of said primary electric current.

19. The apparatus of claim 15 wherein said apparatus is utilized as part of an electric power meter.

20. The apparatus of claim 15 wherein said control means further functions to provide a second information signal for communication to other equipment; said second information signal containing information about said primary electric current.

* * * * *